United States Patent
Schwenk et al.

[19]

[11] Patent Number: 6,151,212
[45] Date of Patent: Nov. 21, 2000

[54] VENTILATED ELECTRONICS CABINET

[75] Inventors: Hans-Martin Schwenk, Wiesenweg; Heinz Kempf, Raiffeisenstrasse; Peter Takats, Pforzheimerstrasse, all of Germany

[73] Assignee: Schroff GmbH, Straubenhardt, Germany

[21] Appl. No.: 09/266,676

[22] Filed: Mar. 11, 1999

[30]  Foreign Application Priority Data

Mar. 13, 1998 [DE] Germany ............................ 198 10 948

[51] Int. Cl.⁷ ...................................................... H05K 7/20
[52] U.S. Cl. ........................ 361/695; 361/690; 361/677; 361/678; 361/689; 174/16.1; 165/80.3; 165/122; 454/184
[58] Field of Search ..................................... 361/690, 694, 361/695, 704; 174/16.1; 165/80.3, 185, 104.33, 122; 454/184

[56]  References Cited

U.S. PATENT DOCUMENTS

| | | | |
|---|---|---|---|
| 4,901,200 | 2/1990 | Mazura | 361/678 |
| 4,997,034 | 3/1991 | Steffen et al. | 165/104.34 |
| 5,544,012 | 8/1996 | Koike | 361/695 |
| 5,745,041 | 4/1998 | Moss | 361/695 |
| 5,773,755 | 6/1998 | Iwatare | 174/17 VA |
| 5,808,866 | 9/1998 | Porter | 361/695 |
| 5,856,909 | 1/1999 | Kamo et al. | 361/695 |

FOREIGN PATENT DOCUMENTS

| | | |
|---|---|---|
| 0 810 704 A2 | 12/1997 | European Pat. Off. . |
| 348794 | 8/1920 | Germany . |
| 35 43 486 A1 | 6/1987 | Germany . |
| 93 06 032 U | 1/1994 | Germany . |
| 295 19 260 U1 | 3/1996 | Germany . |
| 196 23 677 A1 | 12/1997 | Germany . |

*Primary Examiner*—Gerald Tolin
*Assistant Examiner*—Boris L. Chervinsky
*Attorney, Agent, or Firm*—Merchant & Gould P.C.

[57] ABSTRACT

In a double-walled electronics cabinet 1 an axial fan 5 is inserted in its inner wall 2. In order to prevent the creation of air eddies in front of the fan intake 8, an air baffle plate 16, which is in direction of flow, is located over the fan intake 8 in the gap 4 between inner wall 2 and external wall 3. The efficiency of the axial fan 5 is crucially improved by the division of the flow of fresh air, and the creation of air eddies and differences in pressure are purposefully avoided.

12 Claims, 1 Drawing Sheet

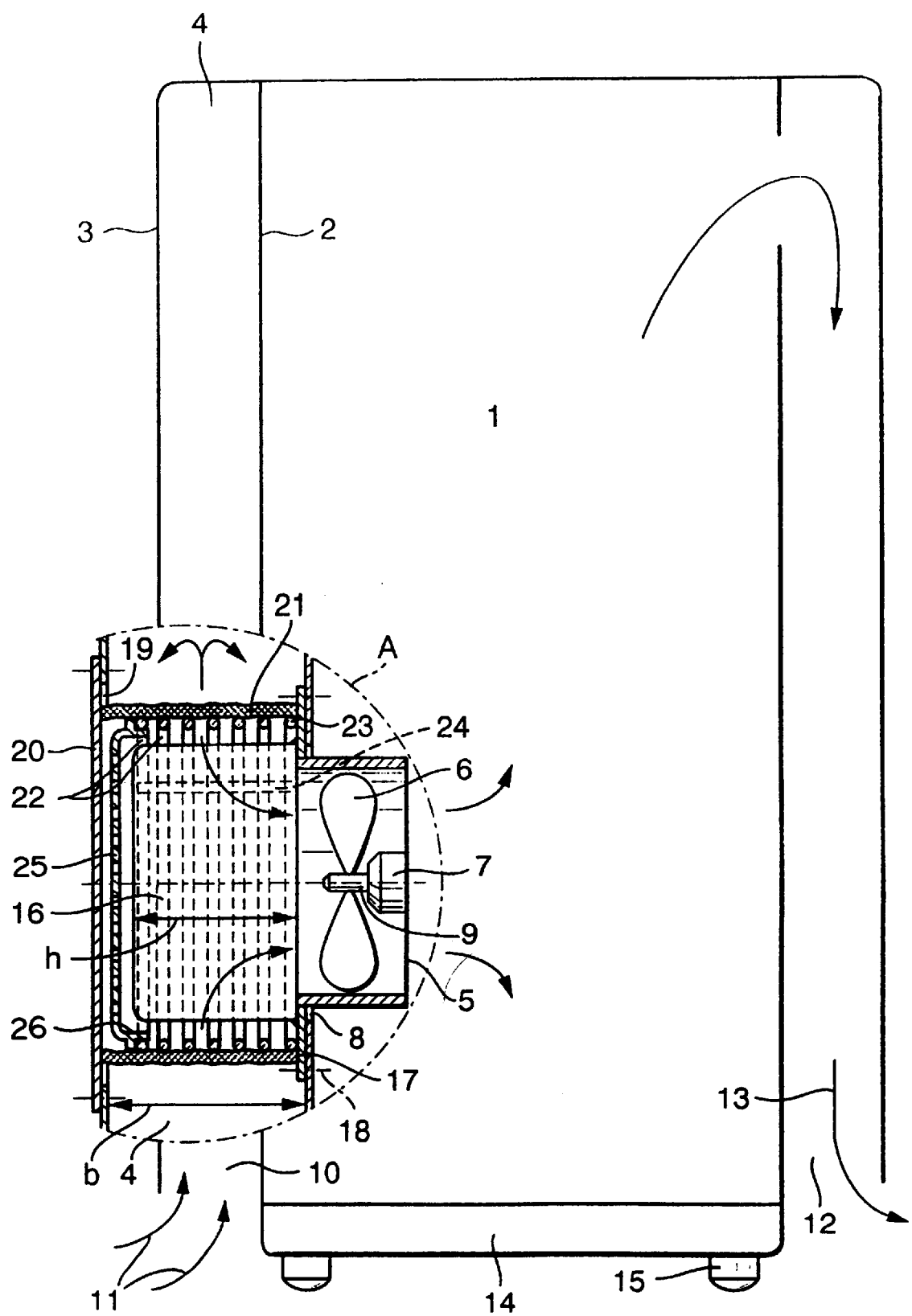

VENTILATED ELECTRONICS CABINET

BACKGROUND OF THE INVENTION

The invention concerns a ventilated electronics cabinet for the accommodation of electrical and electronics components. This cabinet contains an inner wall, external wall, axial fan whose fan intake appears in the inner wall and whose fan axle is perpendicularly to the inner wall, an intake for fresh air that leads into the gap between the inner wall and external wall, and an outlet for the exhaust from the gap.

For many years there have been electronics cabinets which contain double walls. The double wall enables weather-protected applications of such free standing cabinets or housings. Areas of application today include in particular telecommunications mechanisms.

It is well-known to use the gap between the interior and the external wall for the purpose of isolation, cooling, or the heat exchange between inside and outside (DE 348,794, DE 295 19 260, DE 196 23 677, EP 0810 704).

Fans are used for the removal of the dissipated heat from the inserted electrical or electronics components. These send a flow of air through the gaps, which wash around the warming components on the inside of the cabinet. The same arrangement can be also used in order to put a refreshing mantle of air around the internal housing when solar radiation or high ambient temperatures are present.

For the installation of ventilation mechanisms into double-walled electronics cabinets only little space is available for use. Axial fans, which can only necessarily be inserted into the inner wall, after placement, only have the ability to suck fresh air over the narrow gap extending up to the external wall. These fans furnish themselves with only a fraction of their rated output of fresh air. This occurs because the turbulence of the fresh air, which can be sucked in from in front of the fan intake, makes a majority of the exhaust performance useless. Thus the fan produces only about a quarter of the normal amount of air. The problem cannot, in most cases, be solved by the installation of larger ventilation systems for space reasons.

SUMMARY

The task of the invention exists in the improvement of the effectiveness of an exhaust unit for double-walled electronics cabinets and electronics housings.

For the solution of the task one proceeds from a well-known, ventilated electronics cabinet of the type initially described. The task is solved by at least one air baffle plate, which is located in the gap and aligned in the direction of the flow of fresh air. This air baffle plate extends over the fan intake, is aligned with the fan axle, and has a corresponding height, almost the width of the gap.

The suggested air baffle plate attached in front of the fan effectively prevents the production of disturbing air eddies and pressure differences in front of the rotary fan blades. It has been shown, that inserted fan units, with one or also several air baffle plates held next to each other, provide only slight reductions in efficiencies. The air baffle plate divides the fresh air sucked-in into two parallel air flows in front of the fan, these occur separately and without lateral influence on the fan.

For the ease of assembly the axial fan sits on a ring shaped adaptor plate which is fastened to the inner wall and has the ability to be removed.

Serving its purpose the air baffle plate is planned to be located on the adaptor plate.

It is favorable if the air baffle plate is an even, rectangular disk made of corrosion proof metal.

In an arrangement of the invention a service opening is intended at the external wall. This service opening is closed by a removable cover, whose inside diameter is larger than the dimensions of the adaptor plate. This enables the exchange of a defective axial fan without having to open the electronics cabinet and avoids the necessity to switch components off during the repair.

Appropriately the adaptor plate and the service opening are depicted in a circular diagram.

A good ventilation is ensured, if the intake for the fresh air lies in the base area of the electronics cabinet between the inner wall and the external wall, appropriately the axial fan is intended to be above this intake.

In order to effectively prevent the penetration of air pollution, foreign bodies and insects into the inside of the housing, it is appropriate to place an exchangeable air filter in front of the fan intake.

In order to be able to realize as large a filter surface as possible, the air filter is formed as a hollow cylinder and sits in the gap between inner wall and external wall surrounding the fan intake. This air filter thus possesses the form of a short socket, which is squeezed into the gap.

A cylindrical supporting lattice for the air filter is favorably provided, onto which the air filter can be easily pushed.

In addition, the supporting lattice is appropriately fastened to the adaptor plate, but can also be attached to the cover of the service opening.

In order to be able to replace the air filter while the axial fan is running, without the risk of injuries, the supporting lattice contains a removable circular grille.

The grille, which connects to the supporting lattice, is situated closely beneath the cover of the service opening.

BRIEF DESCRIPTION OF THE DRAWING

FIG. 1 shows a side elevational view with a detail portion shown enlarged and in section of a ventilated electronics cabinet according to the principles of the present invention.

DETAILED DESCRIPTION OF THE PREFERRED EMBODIMENT

The invention is represented in the drawing, which is described as follows. In this drawing a simplified and schematic cross section of a ventilated electronics cabinet is represented. The aerator is shown in increased scale within the area indicated by the dashed lines A.

The ventilated electronics cabinet 1 is depicted with double walls, is used for the accommodation of electrical and electronics components, and is predominantly used in open areas.

The electronics cabinet 1 is depicted with double-walls and possesses an inner wall 2 and an external wall 3, which are constructed from corrosion proof steel sheet. Between inner wall 2 and external wall 3 a gap 4 is formed, which is intended for ventilation measures.

At the inner wall 2 an axial fan 5 is set with fan blades 6 on a propelling electric motor 7. The circular fan intake 8 is situated at the inner wall 2, to which the fan axle 9 is perpendicularly.

An intake 10 for the fresh air sucked in from the outside 11 is situated in the area of the base of the electronics cabinet 1 and leads into the gap 4 between the inner wall 2 and the external wall 3. This intake 10 can be protected by a lattice or a finned arrangement (not represented). The axial fan 5 sits above the intake 10.

A discharge 12 for the warmed exhaust air from the gap 4 is opposite the intake 10. Both, intake 10 and discharge 12, are situated in the base 14 area of the electronics cabinet 1, which is set on low feet 15.

An air baffle plate 16 is located in front of, or over, the fan intake 8, which is aligned with the fan axle 9. This air baffle plate 16 is located in the gap 4 between the inner wall 2 and the external wall 3 of the electronics cabinet 1 which is aligned in the direction of the flow of fresh air 11. The height h of the air baffle plate 16 corresponds almost to the width b of the intermediate space 4 and divides the current of fresh air 11 into two halves. These are sucked in separately by the fan blades 6 and sucked through the axial fan 5.

The commercial axial fan 5 sits on a circular, flat adaptor plate 17, which is fastened for removal to the inner wall 2 by screws 18.

The air baffle plate 16 comprises an even, thin, rectangular disk made out of a corrosion resistant material, i.e. out of a surface protected steel sheet or a suitable plastic. The air baffle plate 16 is fastened on the two outside areas of its lower edge to the adaptor plate 17.

At the external wall 3 of the electronics cabinet 1 a service opening 19 is intended, which is closed by a removable cover 20. This service opening 19 enables access to mainly the ventilation unit comprising of the axial fan 5 and its accessories. The service opening 19 and the adaptor plate 17 are circular and the inside diameter of the service opening 19 is somewhat larger than the outside diameter of the adaptor plate 17. This enables the latter to be removed together with the axial fan 5 and the air baffle plate 16 and exchanged.

An air filter 21, which is exchangeable when cleaning, is located in front of the fan intake 8. This air filter 21, which comprises a felt-like filter material, is formed like a hollow cylinder and is suitably inserted into the gap 4 between inner wall 2 and external wall 3.

The air filter 21 surrounds the fan intake 8 and sits with its inside edge close against the adaptor plate 17. Its outside edge touches the inside of the service opening 19 cover 20.

A cylindrical supporting lattice 22 serves to hold the air filter 21, and is fastened to the adaptor plate 17. It can also be set alternatively on the inside of the cover 20 (not represented). The supporting lattice 22 comprises a number or rings 23 lying next to each other, they are of equal diameter and the circular cross section of the surface is of a protected material. The rings are held at a distance from each other by rods 24. The air filter 21 is pushed or drawn up onto the supporting lattice 22.

The supporting lattice 22 supports a circular grille 25, whose high-standing edge 26 is placed onto the supporting lattice 22 allowing for removal. The grille 25 is appropriately located close beneath the cover 20 of the service opening 19 and serves a preventive measure from contacting the turning fan blades 6 during repairs.

List of Reference Symbols

A dashed lines
1 electronics cabinet
2 inner wall
3 external wall
4 gap
5 axial fan
6 fan blades
7 electric motor
8 fan intake
9 fan axle
10 intake
11 fresh air
12 discharge
13 exhaust
14 bases
15 feet
16 air baffle plate
h height
b width
17 adaptor plate
18 screw
19 service opening
20 cover
21 air filter
22 supporting lattice
23 ring
24 rod
25 grille
26 edge

What is claimed is:

1. A ventilated electronics cabinet for the accommodation of electrical and electronic components, comprising:
   an inner wall and
   an external wall, defining a gap intermediate the inner wall and the external wall;
   an axial fan,
   with a fan intake on the inner wall, and
   a fan axle perpendicular to the inner wall,
   an intake for fresh air, which leads into the gap between the inner wall and external wall,
   a discharge for exhaust from the gap,
   at least one air baffle plate (16)
   located in the gap (4),
   and is aligned in a direction of fresh air flow (10),
   which extends over the fan intake (8)
   at a level of the fan axle (9) and
   which has a height (h) that almost corresponds to the width (b) of the intermediate space (4).

2. A ventilated electronics cabinet according to claim 1, wherein the axial fan (5) sits on a circular adaptor plate (17), which is removably fastened to the inner wall (2).

3. A ventilated electronics cabinet according to claim 2, wherein the air baffle plate (16) is located on the adaptor plate (17).

4. A ventilated electronics cabinet according to claim 1, wherein the air baffle plate (16) is a rectangular element made of corrosion proof metal.

5. A ventilated electronics cabinet according to claim 1, wherein the external wall (3) defines a service opening (19), which is closed by a removable cover (20), with a clearance larger than a width of the adaptor plate (17).

6. A ventilated electronics cabinet according to claim 1, wherein the intake (10) for fresh air (1) is situated in an area of the base of the electronics cabinet (1) between the inner wall (2) and the external wall (3), and the axial fan (5) is above the intake (10) for fresh air (1).

7. A ventilated electronics cabinet according to claim 1, further comprising an exchangeable air filter (21) located proximate the fan intake (8).

8. A ventilated electronics cabinet according to claim 7, wherein the air filter (21) is formed as a hollow cylinder, and the air filter (21) sits in the gap (4) between inner wall (2) and external wall (3), and wherein the air filter (21) surrounds the fan intake (8).

9. A ventilated electronics cabinet according to claim 7 further comprising a cylindrical supporting lattice (22) for the air filter (21).

10. A ventilated electronics cabinet according to claim 9, wherein the supporting lattice (22) is fastened to the adaptor plate (17).

11. A ventilated electronics cabinet according to claim 9, wherein the supporting lattice (22) supports a removable circular grille (25).

12. A ventilated electronics cabinet according to claim 1, wherein the grille (25) is situated proximate a lower portion of the cover (20) of the service opening (19).

\* \* \* \* \*